US012579914B2

(12) United States Patent
Yang

(10) Patent No.: US 12,579,914 B2
(45) Date of Patent: Mar. 17, 2026

(54) WINDING-TYPE DISPLAY DEVICE AND METHOD FOR DETECTING LIGHT EMISSION INFORMATION OF WINDING-TYPE DISPLAY DEVICE

(71) Applicant: Sharp Display Technology Corporation, Kameyama City (JP)

(72) Inventor: Yixin Yang, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 210 days.

(21) Appl. No.: 18/691,654

(22) PCT Filed: Nov. 22, 2021

(86) PCT No.: PCT/JP2021/042710
§ 371 (c)(1),
(2) Date: Mar. 13, 2024

(87) PCT Pub. No.: WO2023/089797
PCT Pub. Date: May 25, 2023

(65) Prior Publication Data
US 2025/0131858 A1      Apr. 24, 2025

(51) Int. Cl.
*G09F 9/30* (2006.01)
*G09F 9/33* (2006.01)
*H10K 59/13* (2023.01)
*H10K 102/00* (2023.01)

(52) U.S. Cl.
CPC .............. *G09F 9/301* (2013.01); *G09F 9/335* (2021.05); *H10K 59/13* (2023.02); *H10K 2102/311* (2023.02)

(58) Field of Classification Search
CPC ......... G09F 9/301; G09F 9/335; H10K 59/13; H10K 2102/311
See application file for complete search history.

(56) References Cited

U.S. PATENT DOCUMENTS

| | | | | |
|---|---|---|---|---|
| 2017/0309226 | A1* | 10/2017 | In | G09G 3/035 |
| 2020/0058272 | A1* | 2/2020 | Oh | G09G 5/391 |
| 2020/0337161 | A1* | 10/2020 | Choi | H10K 77/111 |
| 2021/0012715 | A1 | 1/2021 | Ueno et al. | |
| 2022/0377918 | A1* | 11/2022 | Dong | H05K 5/0018 |
| 2023/0030142 | A1* | 2/2023 | Seo | G09F 9/301 |
| 2025/0071916 | A1* | 2/2025 | Yang | G09G 3/035 |

FOREIGN PATENT DOCUMENTS

WO          2019/187068  A1    10/2019

* cited by examiner

*Primary Examiner* — Nathan Milakovich
(74) *Attorney, Agent, or Firm* — ScienBiziP, P.C.

(57) ABSTRACT

A winding-type display device includes a flexible display having a third surface, a protection film configured to be attached to the third surface, a winding roller for winding the display with the protection film outside, a first guide member for winding the protection film peeled from the display, and an image reading sensor disposed between the first guide member and the winding roller for detecting light emission information from the display.

10 Claims, 12 Drawing Sheets

WINDING-TYPE DISPLAY DEVICE AND METHOD FOR DETECTING LIGHT EMISSION INFORMATION OF WINDING-TYPE DISPLAY DEVICE

TECHNICAL FIELD

The disclosure relates to a winding-type display device in which a flexible light-emitting device can be wound and stored, and a method for detecting light emission information of the winding-type display device.

BACKGROUND ART

In the related art, there is known a display device including a display using, for example, an OLED (Organic Light Emitting Diode) having a plurality of electro-optical elements whose luminance and chromaticity are controlled by a current as a display element, a luminance measurement unit for measuring luminance in the display element of the OLED display in a shielded state, and a correction value calculation unit for correcting a data signal to be given to each pixel of the display element based on a measurement result by the luminance measurement unit.

This configuration makes it possible to correct deterioration or unevenness due to a change with time after the use of the OLED display based on the measurement result by the luminance measurement unit.

CITATION LIST

Patent Literature

PTL1: WO 2019/187068

SUMMARY

Technical Problem

However, when dust in the environment adheres to the light-emitting face of the OLED display during use of the OLED display, there is a problem in that the luminance measurement unit cannot accurately read image information, and the data signal given to each pixel of the display element cannot be appropriately corrected.

An aspect of the disclosure is to provide a winding-type display device capable of appropriately correcting a data signal supplied to each pixel of a display element, and a method of detecting light emission information of a winding-type display device.

Solution to Problem

In order to solve the problem above, according to an aspect of the disclosure, there is provided a winding-type display device including: a light-emitting device which is flexible, the light-emitting device including a light-emitting face; a protection film configured to be attached to the light-emitting face; a roller configured to wind the protection film and the light-emitting device with the protection film outside the light-emitting device; a first guide member configured to guide the protection film peeled from the light-emitting device when the protection film and the light-emitting device are wound around the roller; and an image reading sensor configured to detect light emission information from the light-emitting face of the light-emitting device from which the protection film is peeled, wherein the protection film guided by the first guide member is attached again to the light-emitting face of the light-emitting device when the light-emitting face of the light-emitting device is wound by the roller onto a downstream side of a detection position of the light emission information by the image reading sensor.

In order to solve the problem above, according to an aspect of the disclosure, there is provided a method for detecting light emission information of a winding-type display device including: winding a protection film configured to be attached to a light-emitting face of a light-emitting device which is flexible and the light-emitting device around a roller or unwinding the protection film and the light-emitting device from the roller with the protection film outside the light-emitting device; peeling the protection film from the light-emitting device when the protection film is wound around the roller or unwound from the roller and guiding the protection film by a first guide member; detecting, by an image reading sensor, light emission information from the light-emitting face of the light-emitting device from which the protection film is peeled; and attaching the protection film guided by the first guide member to the light-emitting face of the light-emitting device again when the light-emitting face of the light-emitting device is wound by the roller onto a downstream side of a detection position of the light emission information by the image reading sensor or is unwound onto an upstream side of the detection position of the light emission information by the image reading sensor.

Advantageous Effects of Disclosure

According to an aspect of the disclosure, the data signal given to each pixel of the display element can be appropriately corrected.

DESCRIPTION OF EMBODIMENTS

Figure 1:
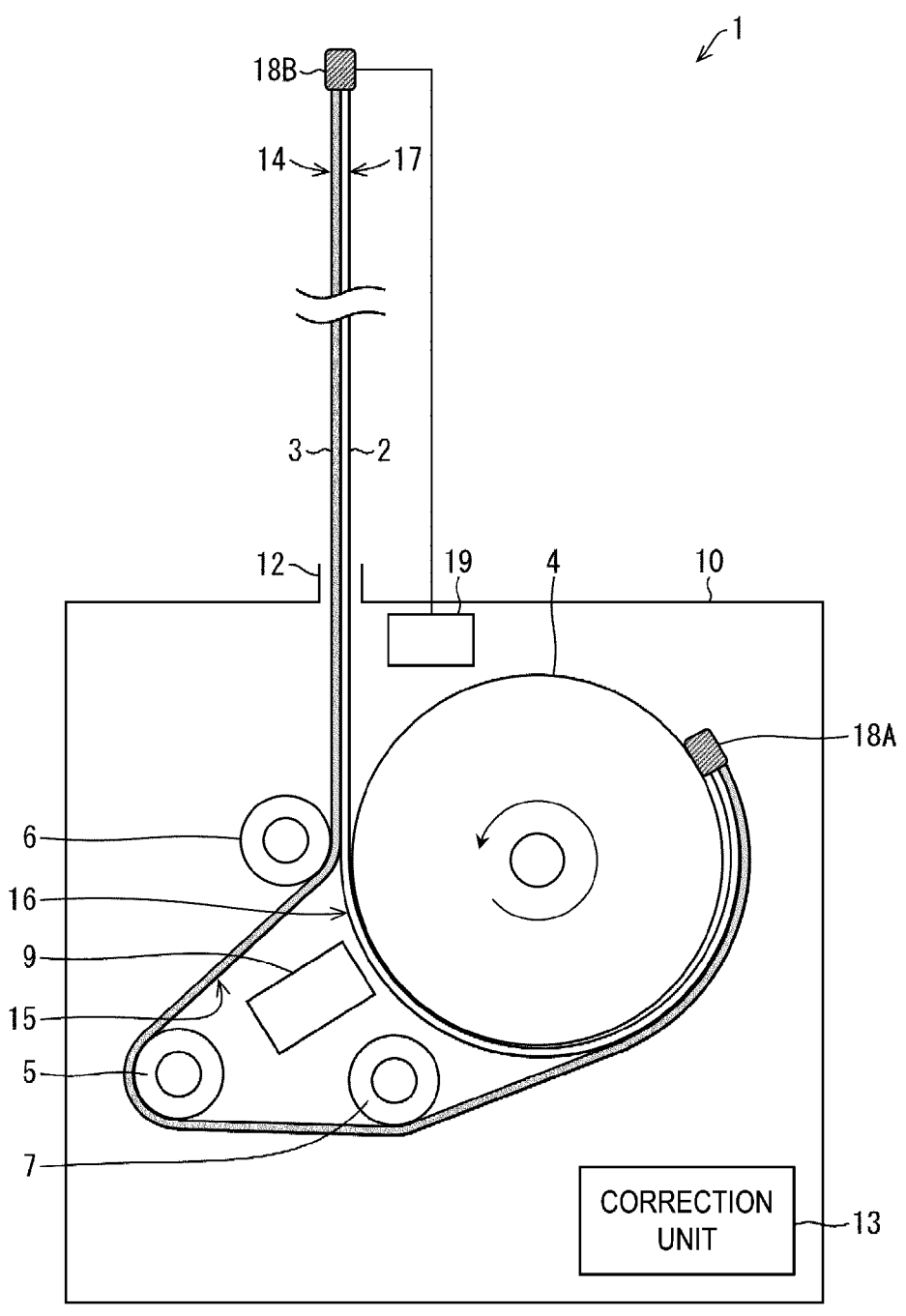
FIG. 1 is a configuration diagram of a winding-type display device according to an embodiment.

FIG. 1 is a configuration diagram of a winding-type display device 1 according to an embodiment. The winding-type display device 1 includes a flexible display 2 (light-emitting device) having a third surface 16 (light-emitting face) and a fourth surface 17, a protection film 3 attached to the third surface 16 of the display 2 to prevent dust from adhering to the third surface 16, a winding roller 4 (roller) that winds the protection film 3 and the display 2 with the protection film 3 outside the display 2, a first guide member 5 wound with the protection film 3 peeled off from the display 2 when the protection film 3 and the display 2 are wound around the winding roller 4, and an image reading sensor 9 disposed between the first guide member 5 and the winding roller 4 to detect light emission information from the third surface 16 of the display 2 from which the protection film 3 is peeled.

Note that a flexible light-emitting product may be provided instead of the flexible display 2. For example, a flexible illumination device, or a matrix-shaped OLED lamp may be provided.

When the third surface 16 of the display 2 is wound by the winding roller 4 onto the downstream side of the detection position of the light emission information detected by the image reading sensor 9, the protection film 3 wound around the first guide member 5 is attached again to the third surface 16 of the display 2.

The protection film 3 has a first surface 14 on the side opposite to the display 2 and a second surface 15 on the side of the display 2.

The winding-type display device 1 further includes a second guide member 6 for winding the protection film 3 on the side opposite to the display 2 of the protection film 3 at a position where the display 2 starts to come into contact with the winding roller 4 when the display 2 is wound.

The winding-type display device 1 further includes a third guide member 7 which is disposed between the first guide member 5 and the winding roller 4 and winds the protection film 3 on the side opposite to the winding roller 4.

The winding-type display device 1 further includes a box 10 which accommodates the winding roller 4, the first to third guide members 5 to 7, and the image reading sensor 9 so as to be shielded from dust and external light. The box 10 has an entrance 12 through which the display 2 with the protection film 3 is attached enters and exits.

If the first guide member 5 is configured to have a large diameter, the third guide member 7 may not be provided. The second guide member 6 is preferably disposed near the image reading sensor 9.

After the light emission information is detected by the image reading sensor 9, the display 2 is quickly attached again to the protection film 3 so that dust does not adhere thereto.

The first to third guide members 5 to 7 are preferably provided so as to be rotatable in accordance with winding of the protection film 3 around the winding roller 4. The display 2 preferably includes an OLED.

The winding-type display device 1 further includes a fixing tool 18A for fixing one end of the protection film 3 to one end of the display 2, a fixing tool 18B for fixing the other end of the protection film 3 to the other end of the display 2, and a pull-out device 19 for pulling out the display 2 and the protection film 3 to the outside of the box 10.

The winding-type display device 1 further includes a correction unit 13 that corrects the light emission luminance of the third surface 16 of the display 2 based on the light emission information from the third surface 16 of the display 2 detected by the image reading sensor 9. The correction unit 13 is accommodated in the box 10.

The winding-type display device 1 formed as described above works as follows.

First, in order to prevent dust from adhering to the third surface 16 of the flexible display 2, the display 2 is wound around the winding roller 4 with the protection film 3 attached to the third surface 16 facing outward (winding step).

Then, when the display 2 is wound around the winding roller 4, the protection film 3 is peeled off from the display 2 and wound around the first guide member 5 (peeling step).

Next, light emission information from the third surface 16 of the display 2 is detected by the image reading sensor 9 disposed between the first guide member 5 and the winding roller 4 (detecting step).

Thereafter, the protection film 3 is attached to the display 2 to be wound around the winding roller 4 (attaching step).

As described above, by providing the protection film 3 on the third surface 16 of the display 2, dust in the environment does not come into contact with the front surface of the display 2. At the time of image capturing sensing, the image reading sensor 9 is disposed to be opposed to the third surface 16 of the display 2 from which the protection film 3 is peeled off. Therefore, the image reading sensor 9 can read correct light emission information which is not affected by dust adhering to the protection film 3. The correction unit 13 corrects the light emission luminance and chromaticity based on the light emission information read by the image reading sensor 9.

The image reading sensor 9 is installed in a space formed between the protection film 3 peeled off from the display 2 and the display 2 wound around the winding roller 4.

Both ends of the protection film 3 are fixed to both ends of the display 2 by fixing tools 18A and 18B. The image reading sensor 9 and the winding mechanism including the winding roller 4 are installed in the box 10 free from dust. At the time of unwinding the display 2, the display 2 is unwound from the box 10 to the outside of the box 10 while the protection film 3 and the display 2 are laminated (attached). When the display 2 is returned into the box 10, the protection film 3 attached (laminated) to the display 2 is peeled off (separated (delaminated)) from the display 2 in the box 10, and after the display 2 passes through the image reading sensor 9, the protection film 3 is attached (relaminated) to the display 2 again and is wound around the winding roller 4.

The protection film 3 and the display 2 enter into the box 10 to be integrated. The box 10 including the display 2 can be moved by transportation. The display 2 can automatically correct light emission luminance and chromaticity when it is not used.

As described above, the protection film 3 is provided on the third surface 16 which is the light-emitting face of the display 2 of the winding-type display device 1, contact between the front surface of the display 2 and dust in the environment is avoided, and true light emission image information which is not affected by adhered dust is sensed by the image reading sensor 9. Then, the light emission luminance and chromaticity of the display 2 are corrected by the correction unit 13 based on the sensed light emission image information.

The protection film 3 may be an anti-glare type or a glare type. In the case of the anti-glare type, data can be acquired without using an anti-glare type film.

The detection timing of the light emission information by the image reading sensor 9 may be arbitrary.

Figure 2:
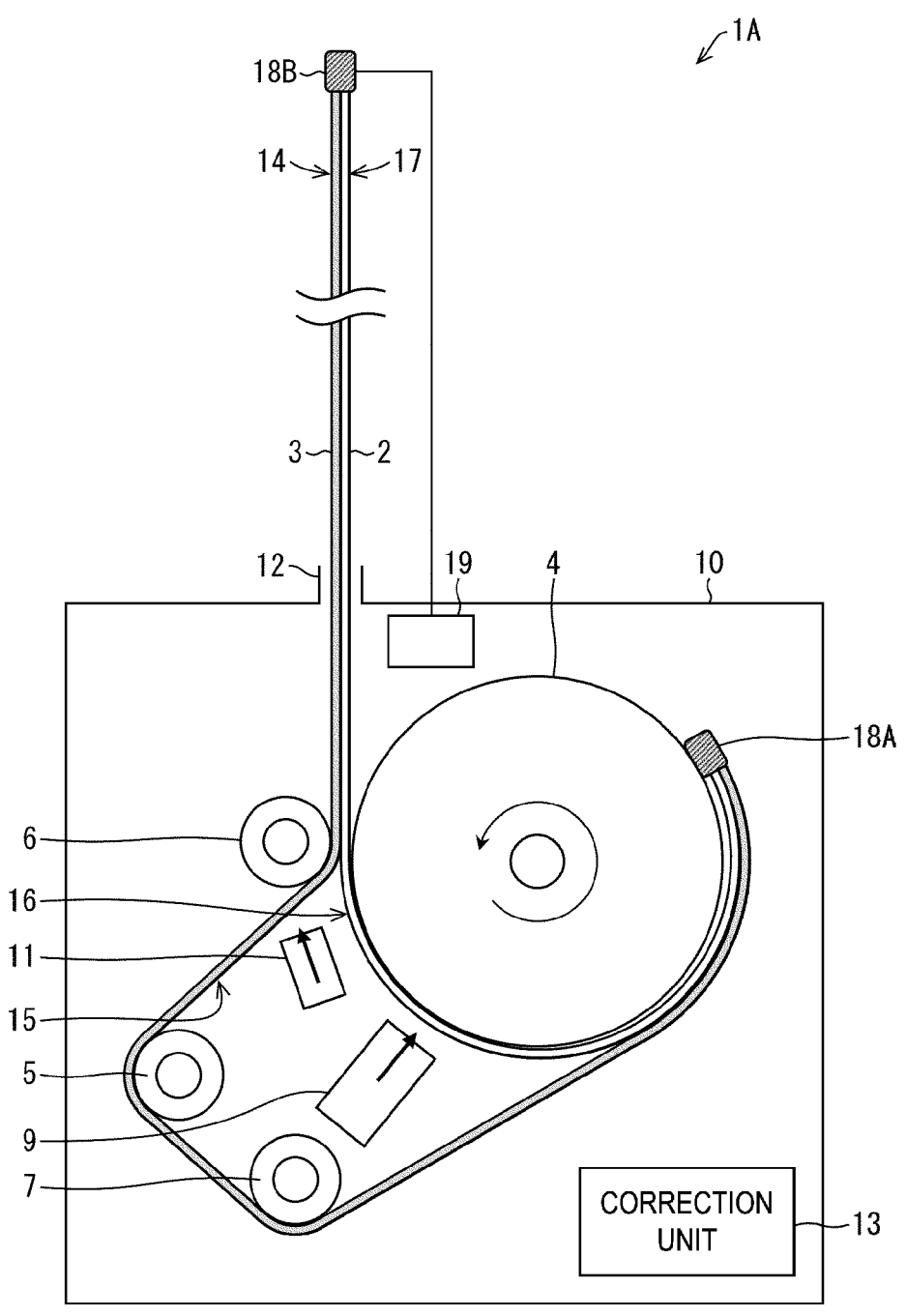
FIG. 2 is a configuration diagram of a modified example of the winding-type display device.

FIG. 2 is a configuration diagram of a winding-type display device 1A according to a modified example. The same constituent elements as the constituent elements described above are denoted by the same reference numerals and signs, and detailed descriptions thereof are not repeated.

The winding-type display device 1A further includes an electrostatic control device 11 disposed between the first guide member 5 and the winding roller 4 for controlling static electricity generated in accordance with peeling of the protection film 3 from the display 2 by plasma. The electrostatic control device 11 controls the adhesive force between the protection film 3 and the display 2.

Note that, although an example in which the protection film 3 and the display 2 are attached to each other by electrostatic force has been described, they may be attached to each other by an adhesive layer.

The box 10 is configured such that dust adhering to the first surface 14 of the protection film 3 does not enter the third surface 16 of the display 2 from which the protection film 3 is peeled.

A problem may be generated in that static electricity is generated when the protection film 3 and the display 2 are laminated (attached) and delaminated (peeled).

Thus, as illustrated in FIG. 2, the electrostatic control device 11 is provided in the box 10 to control static electricity at the time of lamination (attaching) and delamination (peeling) of the protection film 3 and the display 2. Controlled static electricity facilitates lamination and delamination.

The electrostatic control device 11 is provided so as to facilitate lamination (attaching) and delamination (peeling) of the protection film 3 and the display 2, and static electricity is controlled at the time of lamination and delamination of the protection film 3 and the display 2. The protection film 3 may be a film with an environmental light anti-reflective function.

Figure 3:
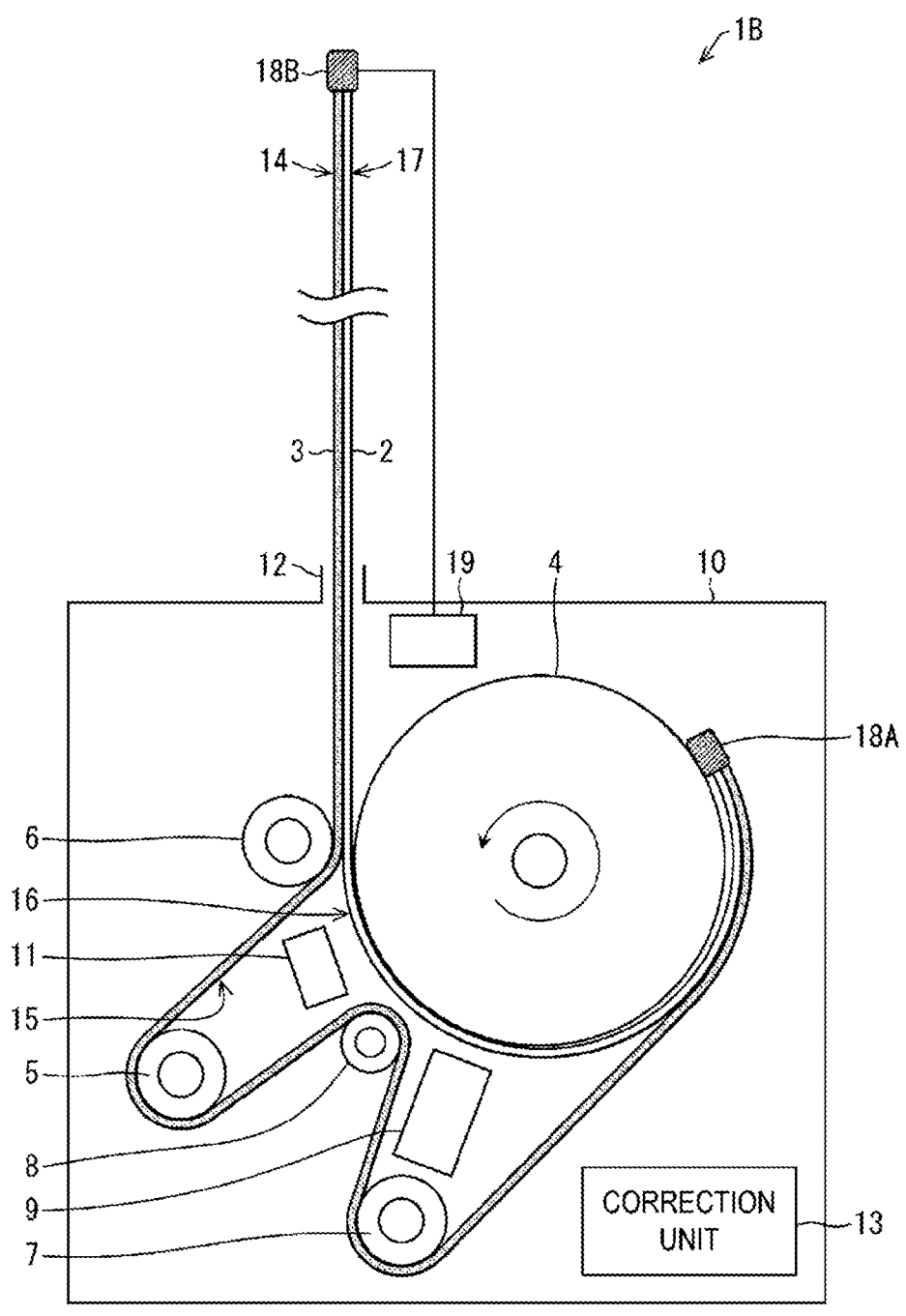
FIG. 3 is a configuration diagram of another modified example of the winding-type display device.

FIG. 3 is a configuration diagram illustrating a winding-type display device 1B according to another modified example. The same constituent elements as the constituent elements described above are denoted by the same reference numerals and signs, and detailed descriptions thereof are not repeated.

The first guide member 5 is disposed on the side opposite to the winding roller 4 with respect to the electrostatic control device 11.

The winding-type display device 1B further includes the third guide member 7 disposed on the side opposite to the winding roller 4 with respect to the image reading sensor 9 and winding the protection film 3 to be wound around the winding roller 4, and a fourth guide member 8 disposed between the first guide member 5 and the third guide member 7 and winding the protection film 3 on the side opposite to the display 2 of the protection film 3. The influence of plasma from the electrostatic control device 11 on the image reading sensor 9 can be reduced by the fourth guide member 8.

The box 10 is configured such that dust adhering to the first surface 14 of the protection film 3 does not enter the third surface 16 of the display 2 from which the protection film 3 is peeled.

Figure 4:
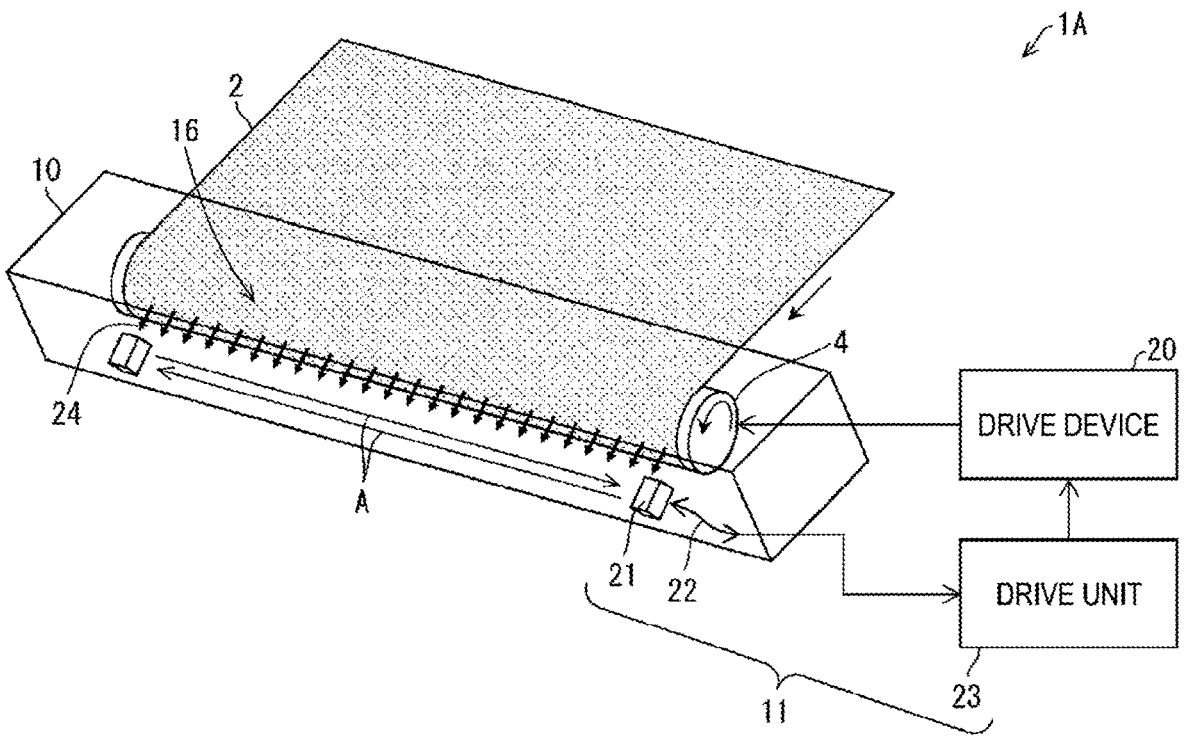
FIG. 4 is a perspective view for explaining an electrostatic control device provided in the winding-type display device.

FIG. 4 is a perspective view for explaining the electrostatic control device 11 provided in the winding-type display device 1A. The same constituent elements as the constituent elements described above are denoted by the same reference numerals and signs, and detailed descriptions thereof are not repeated. Note that, in FIG. 4, the protection film 3 and the image reading sensor 9 are omitted for ease of understanding.

The winding-type display device 1A further includes a drive device 20 driving the winding roller 4. The electrostatic control device 11 includes a point-type electrostatic control head 21 that moves back and forth between one end and the other end of the display 2 along an arrow A to control charged particles related to static electricity generated in accordance with peeling of the protection film 3 from the display 2, flexible wiring 22 connected to the electrostatic control head 21, and a drive unit 23 connected to the wiring 22 to drive the drive device 20. The drive device 20 and the drive unit 23 are actually provided in the box 10.

While the winding roller 4 winds the display 2, the electrostatic control head 21 scans the third surface 16 of the display 2 along the direction of arrow A to attach or remove static electricity.

Figure 5:
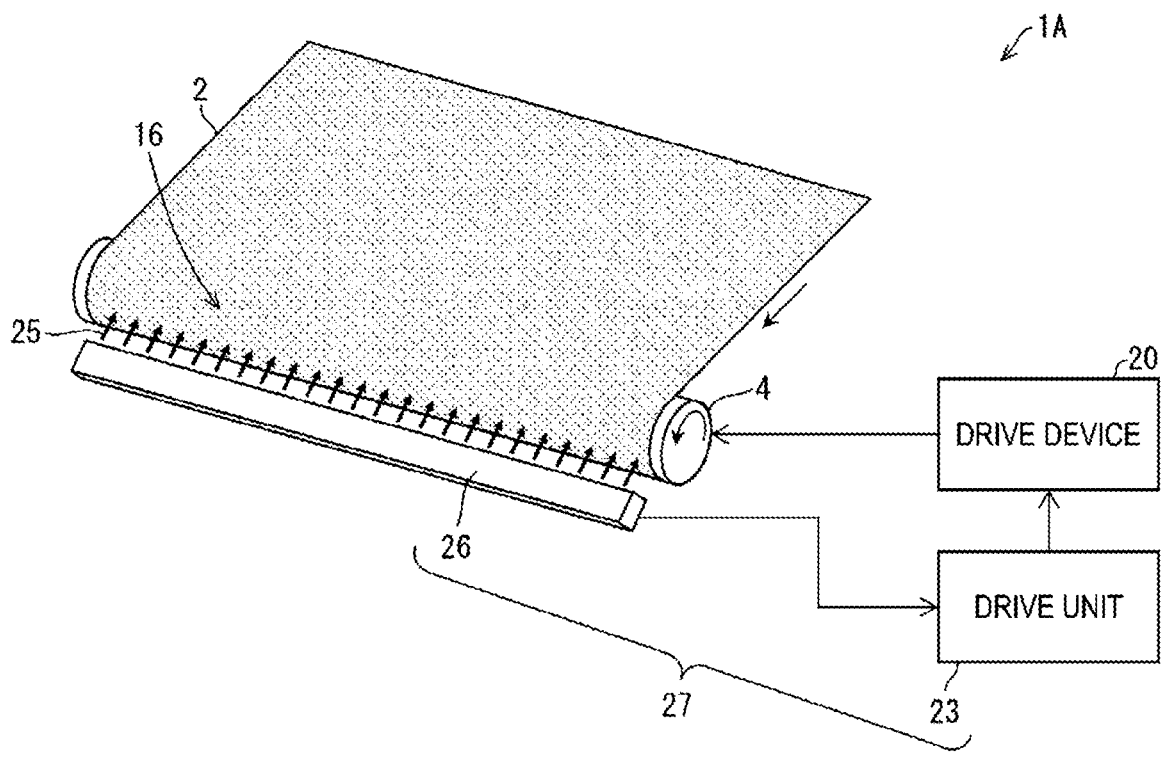
FIG. 5 is a perspective view for explaining a modified example of the electrostatic control device provided in the modified example of the display device.

FIG. 5 is a perspective view for explaining an electrostatic control device 27 provided in the display device 1A. The same constituent elements as the constituent elements described above are denoted by the same reference numerals and signs, and detailed descriptions thereof are not repeated.

The display device 1A may include the electrostatic control device 27 instead of the electrostatic control device 11. The electrostatic control device 27 includes a linear electrostatic control head 26 extending between one end and the other end of the display 2, and the drive unit 23 connected to the electrostatic control head 26 for driving the drive device 20.

While the winding roller 4 winds the display 2, the electrostatic control head 26 attaches or removes static electricity to/from the third surface 16 of the display 2.

Figure 6:
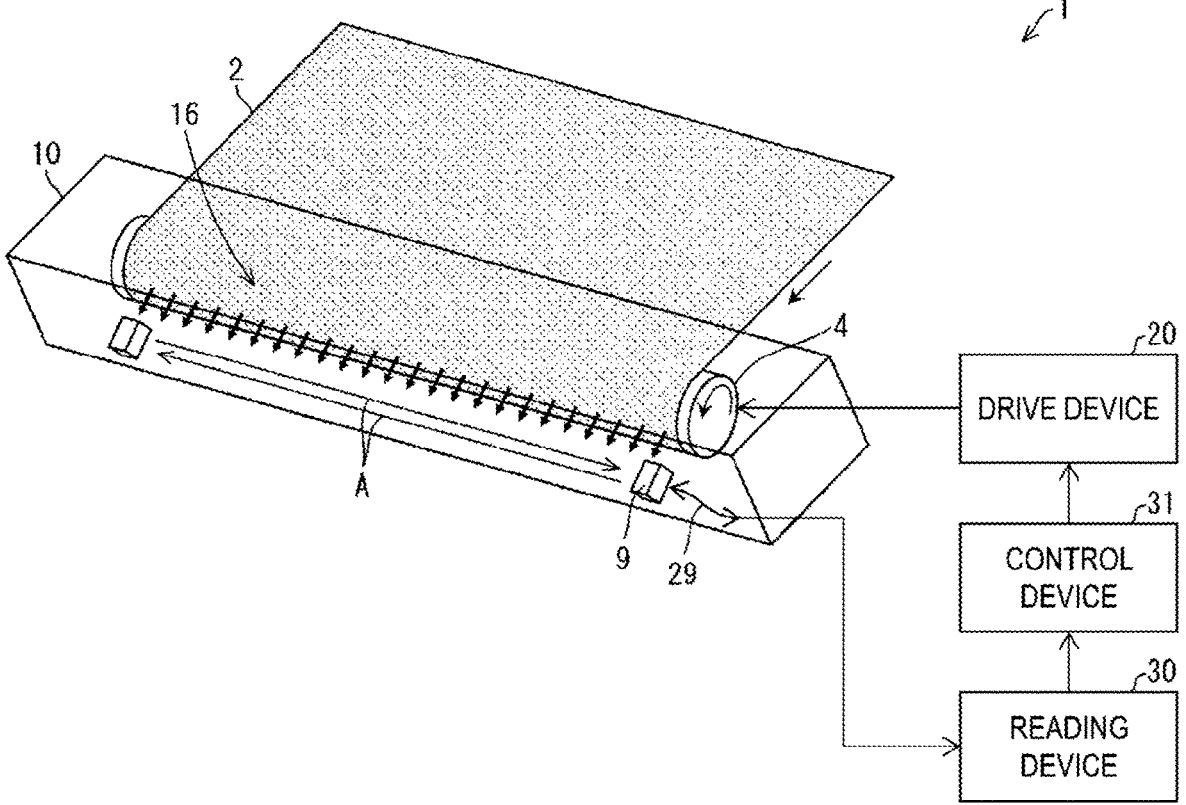
FIG. 6 is a perspective view for explaining an image reading sensor provided in the winding-type display device.

FIG. 6 is a perspective view for explaining the image reading sensor 9 provided in the winding-type display device 1. The same constituent elements as the constituent elements described above are denoted by the same reference numerals and signs, and detailed descriptions thereof are not repeated. Note that, in FIG. 6, the protection film 3 and electrostatic control device 11 are omitted for easy understanding.

The image reading sensor 9 moves back and forth between one end and the other end of the display 2 along the arrow A to detect the light emission information from third surface 16 of the display 2.

The winding-type display device 1 includes a flexible wiring 29 connected to the image reading sensor 9, a reading device 30 connected to the wiring 29 and reading the light emission information detected from the third surface 16 of the display 2 by the image reading sensor 9, and a control device 31 controlling the drive device 20 according to a reading state of the light emission information by the reading device 30.

While the winding roller 4 winds the display 2 stepwise, the image reading sensor 9 scans the third surface 16 of the display 2 along the direction of the arrow A to detect light emission information, and inputs the light emission information to the reading device 30 via the wiring 29.

The drive device 20, the control device 31 and the reading device 30 may be installed in the box 10.

Figure 7:
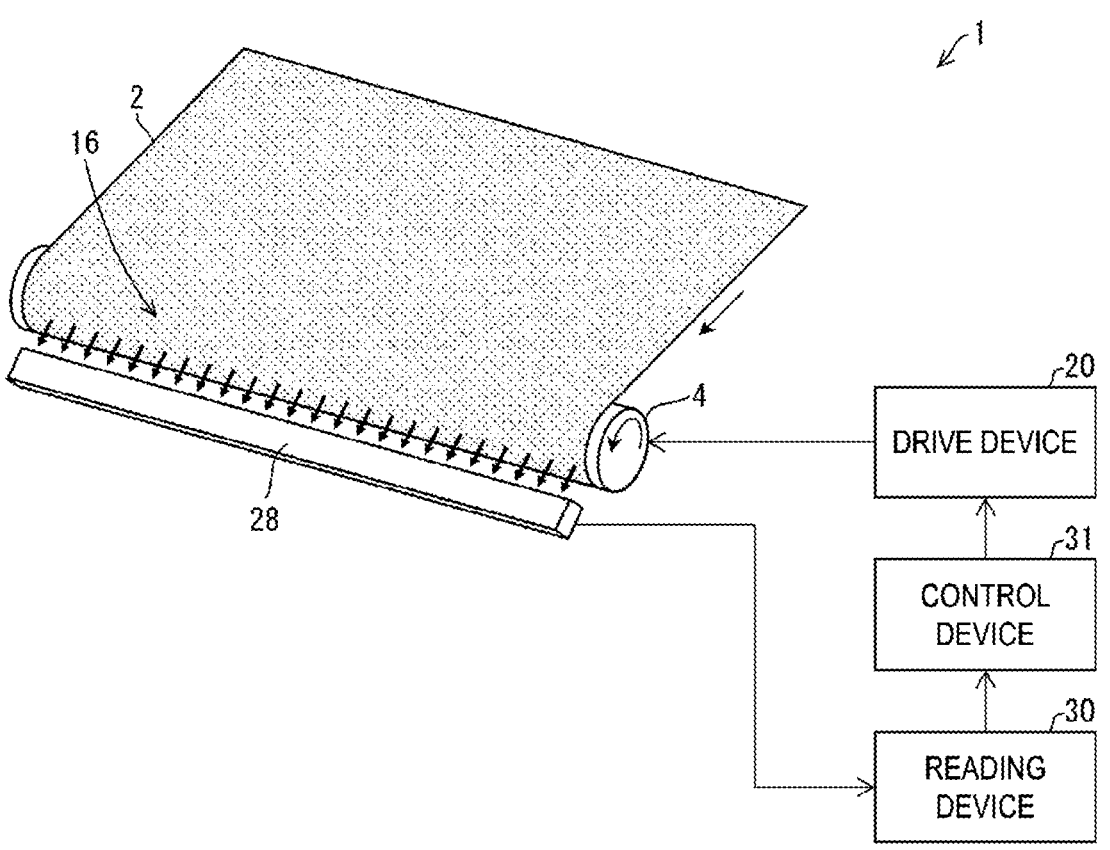
FIG. 7 is a perspective view for explaining a modified example of the image reading sensor provided in the display device.

FIG. 7 is a perspective view for explaining an image reading sensor 28 provided in the display device 1. The same constituent elements as the constituent elements described above are denoted by the same reference numerals and signs, and detailed descriptions thereof are not repeated.

The display device 1 may include the image reading sensor 28 instead of the image reading sensor 9. The image reading sensor 28 is a linear image reading sensor that extends between one end and the other end of the display 2.

While the winding roller 4 winds the display 2 stepwise, the image reading sensor 28 detects light emission information from one end to the other end of the third surface 16 of the display 2, and inputs the light emission information to the reading device 30.

Figure 8:
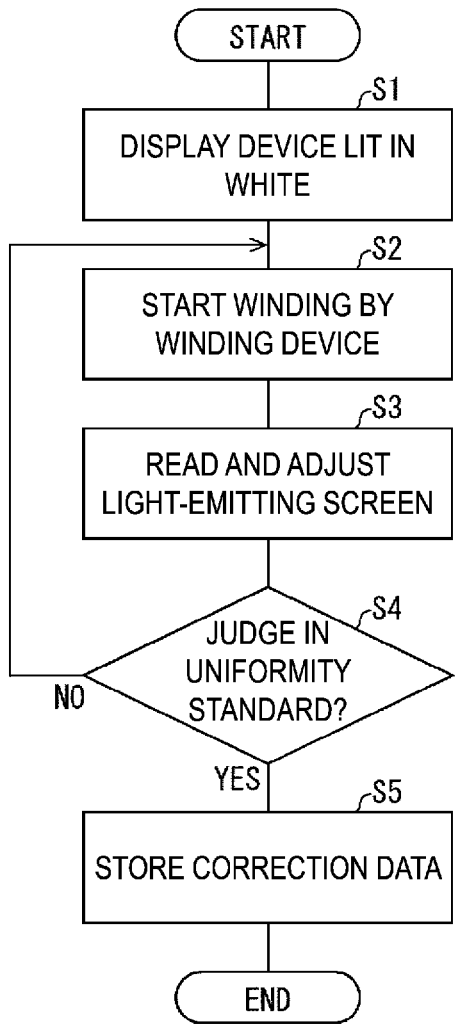
FIG. 8 is a flowchart of correcting gray scale level 1 of white by the winding-type display device.

FIG. 8 is a flowchart of correcting gray scale level 1 of white by the winding-type display device 1.

First, the display 2 to which the protection film 3 is attached is lit in white in a state of being unwound from the box 10 (step S1). Then, winding of the display 2 is started by the winding roller 4 (step S2). Next, the third surface 16 of the display 2 lit in white is read by the image reading sensor 9 (step S3).

Figure 9:
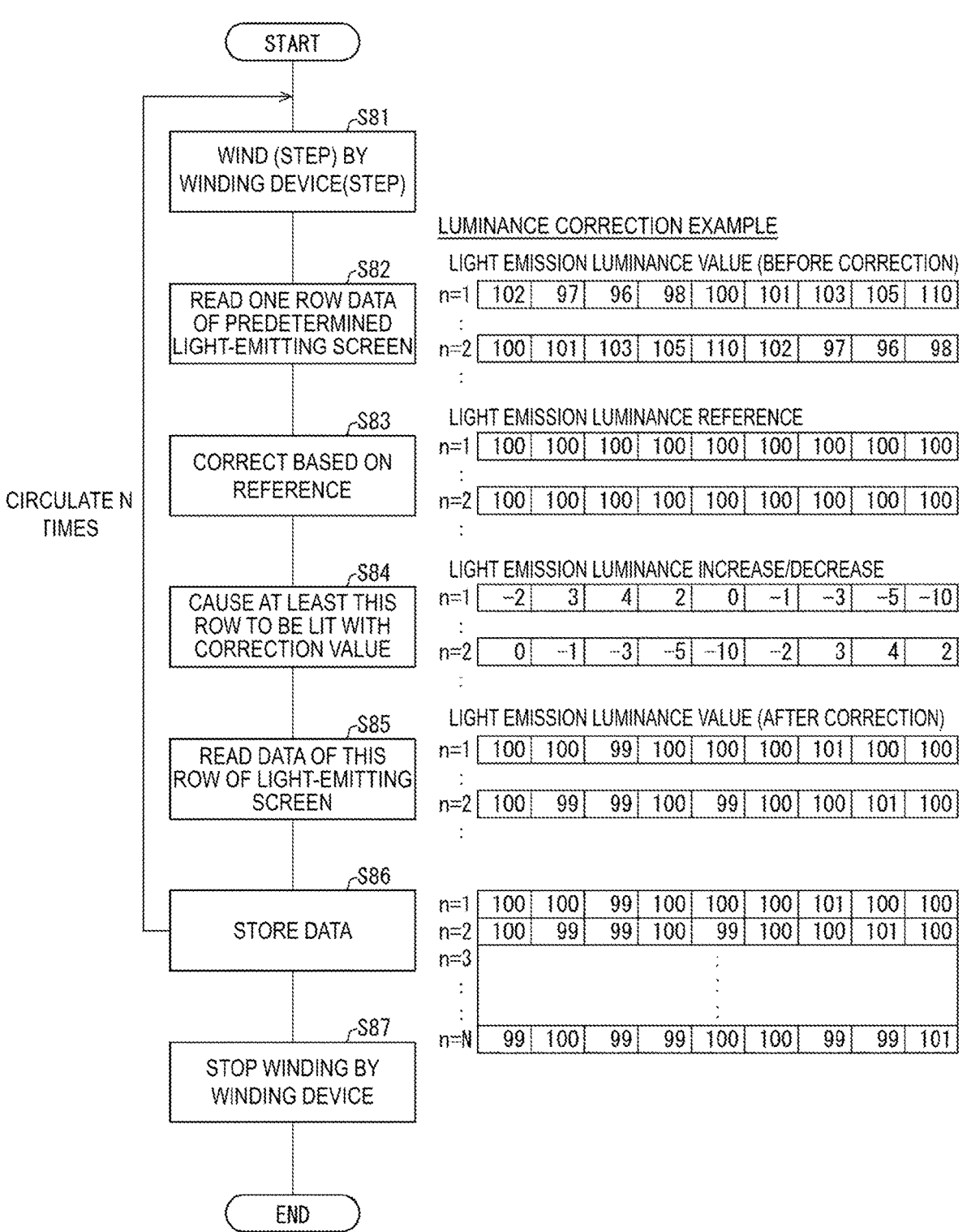
FIG. 9 is a flowchart illustrating details of a light-emitting screen reading and adjusting process according to the flowchart of correcting the gray scale level 1 of white illustrated in FIG. 8.

FIG. 9 is a flowchart illustrating details of the light-emitting screen reading and adjusting process (step S3) according to the flowchart of correcting the gray scale level 1 of white illustrated in FIG. 8.

First, the winding roller 4 winds the display 2 stepwise (step S81). Then, the image reading sensor 9 reads one row data of the predetermined light-emitting screen on the third surface 16 of the display 2 from which the protection film 3 is peeled (step S82).

Next, the correction unit 13 corrects the one row data of the predetermined light-emitting screen read by the image reading sensor 9 on the basis of the light emission luminance reference (step S83). Thereafter, the row corresponding to the one row data of the display 2 is caused to emit light based on the correction value corrected in step S83 (step S84).

Then, the image reading sensor 9 reads the one row data of the predetermined light-emitting screen of the display 2 again (step S85). Next, the correction unit 13 stores the one row data of the predetermined light-emitting screen read in step S85 in a temporary storage unit (not illustrated) (step S86).

The winding-type display device 1 repeats the processing from step S81 to step S86 n=N times.

Thereafter, the winding roller 4 stops the winding operation of the display 2 (step S87).

For example, when the winding roller 4 advances winding of the display 2 one row of the predetermined light-emitting screen of the display 2 at a time, first, processing related to light emission and measurement (step S82), correction value calculation (step S83), correction (light emission) (step S84), re-measurement (step S85), and storage (step S86) is executed at the bottom row of the predetermined light-emitting screen. Then, the winding roller 4 winds one row of the display 2, and light emission and measurement (step S82), correction value calculation (step S83), correction (light emission) (step S84), re-measurement (step S85), and storage (step S86) are executed for the second row from the bottom of the predetermined light-emitting screen in the same manner.

Next, the winding roller 4 further winds one row of the display 2, and the same processing is executed for the third row from the bottom of the predetermined light-emitting screen. Thereafter, in the same manner, the same processing is executed for the N-th row from the bottom of the predetermined light-emitting screen.

For example, when the one row data read in step S82 includes 102, 97, 96, 98, 100, 101, 103, 105, and 110 at the bottom row of the predetermined light-emitting screen, the increase/decrease values of the light emission luminance data for causing the display 2 to emit light are −2, 3, 4, 2, 0, −1, −3, −5, and −10 with respect to the light emission luminance references 100, 100, 100, 100, 100, 100, 100, 100, 100.

Then, the row corresponding to the one row data of the display 2 is caused to emit light based on the correction value by the light emission luminance data (step S84). Next, the image reading sensor 9 reads one row data of the predetermined light-emitting screen of the display 2 again (step S85). When the one row data of the predetermined light-emitting screen read in step S85 include 100, 100, 99, 100, 100, 100, 101, 100, 100, the one row data is stored in the temporary storage unit (step S86).

Note that the above-described processing can be performed by an unwinding operation, and in this case, the processing is executed from the top row of the predetermined light-emitting screen. The winding may be advanced by a plurality of rows.

Then, the correction unit 13 calculates uniformity (variation) of the N pieces of one row data related to luminance re-measured in step S85 and stored in the temporary storage unit, and compares the calculated uniformity with the specified target uniformity value. When the uniformity (variation) is equal to or greater than the specified target uniformity value (NO in step S4), the processing returns to step S2. When the uniformity (variation) is less than the specified target uniformity value (YES in step S4), the correction unit 13 stores the N pieces of one row data in a storage unit (not illustrated) (step S5).

Figure 10:
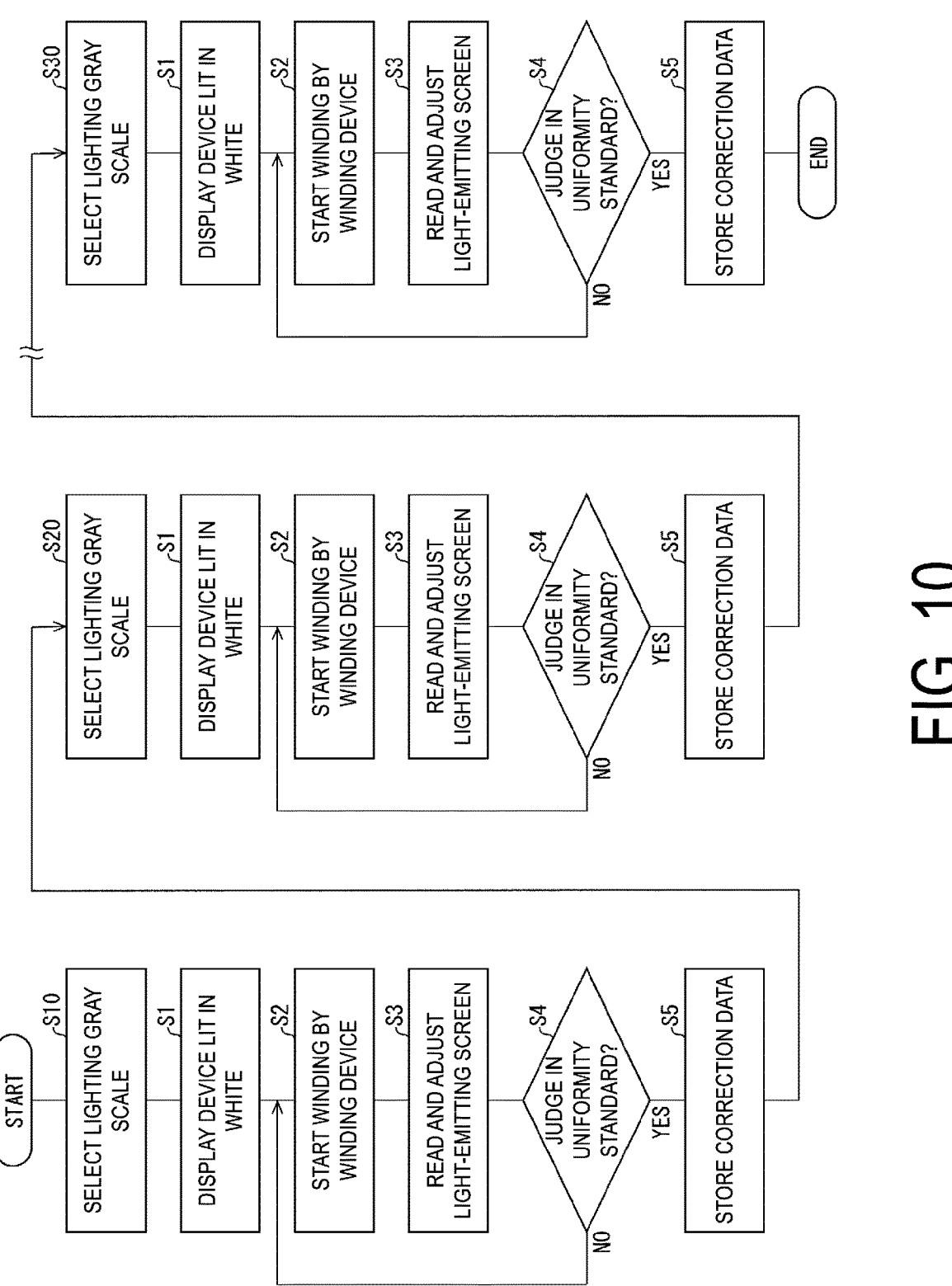
FIG. 10 is a flowchart of correcting multi-gray scale of white by the winding-type display device.

FIG. 10 is a flowchart of correcting multi-gray scale of white by the winding-type display device 1. The same constituent elements as the constituent elements described above are denoted by the same reference numerals and signs, and detailed descriptions thereof are not repeated.

First, for example, 255 lighting gray scales are selected (step S10). Then, the display 2 to which the protection film 3 is attached is lit in white in a state of being unwound from the box 10 (step S1). Next, winding of the display 2 is started by the winding roller 4 (step S2). Thereafter, the image reading sensor 9 reads the third surface 16 of the display 2 lit in white (step S3).

Then, the correction unit 13 calculates uniformity (variation) of the N pieces of one row data related to luminance re-measured in step S85 and stored in the temporary storage unit, and compares the calculated uniformity with the specified target uniformity value. When the uniformity (variation) is equal to or greater than the specified target uniformity value (NO in step S4), the processing returns to step S2. When the uniformity (variation) is less than the specified target uniformity value (YES in step S4), the correction unit 13 stores the N pieces of one row data in a storage unit (not illustrated) (step S5).

Then, after the display 2 is wound, other 120 lighting gray scales, for example, are selected (step S20). Thereafter, the processing of steps S1 to S5 is executed in the same manner. Next, after the display 2 is wound, other 60 lighting gray scales, for example, are further selected (step S30). Thereafter, the processing of steps S1 to S5 is executed in the same manner.

Figure 11:
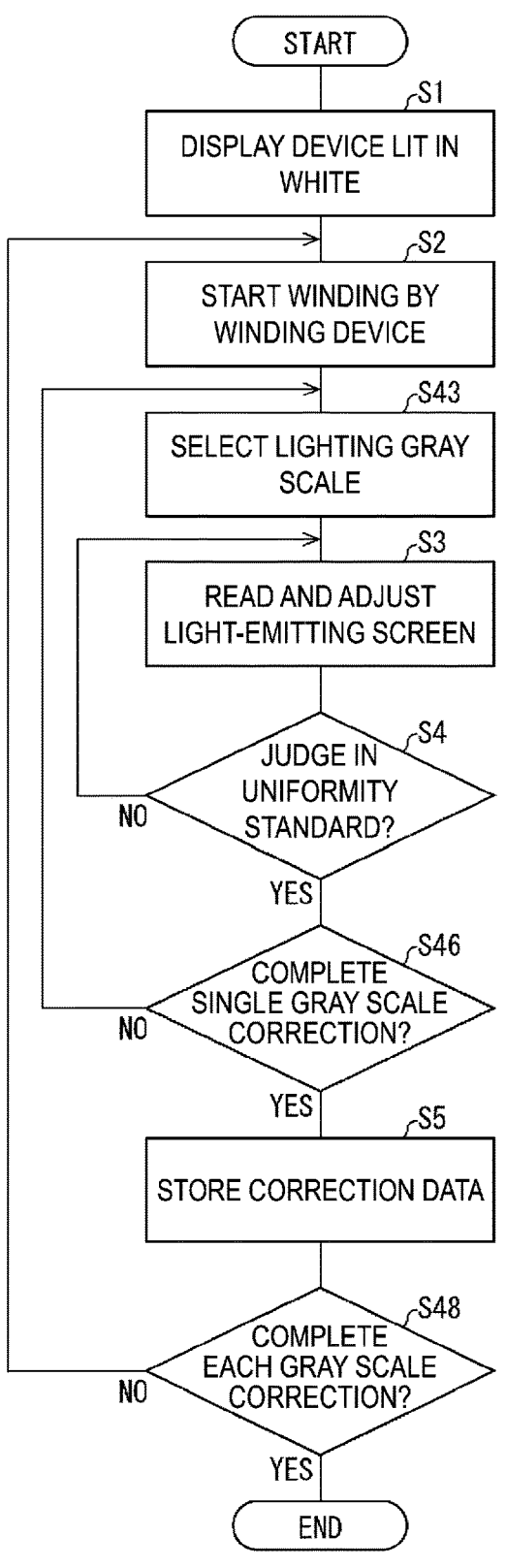
FIG. 11 is a flowchart of correcting another multi-gray scale of white by the winding-type display device.

FIG. 11 is a flowchart of correcting another multi-gray scale of white by the winding-type display device 1. The same constituent elements as the constituent elements described above are denoted by the same reference numerals and signs, and detailed descriptions thereof are not repeated.

First, the display 2 to which the protection film 3 is attached is lit in white in a state of being unwound from the box 10 (step S1). Then, winding of the display 2 is started by the winding roller 4 (step S2).

Next, a lighting gray scale is selected (step S43). Thereafter, the image reading sensor 9 reads the third surface 16 of the display 2 lit in white (step S3).

Then, the correction unit 13 calculates uniformity (variation) of the N pieces of one row data related to luminance re-measured in step S85 and stored in the temporary storage unit, and compares the calculated uniformity with the specified target uniformity value. When the uniformity (variation) is equal to or greater than the specified target uniformity value (NO in step S4), the processing returns to step S3. When the uniformity (variation) is less than the specified target uniformity value (YES in step S4), it is determined whether or not the single-gray scale correction is completed (step S46). When it is determined that the single-gray scale correction is not completed (NO in step S46), the processing returns to step S43. When it is determined that the single-gray scale correction is completed (YES in step S46), the correction unit 13 stores the N pieces of one row data in a storage unit (not illustrated) (step S5).

Next, it is determined whether or not the correction of each gray scale is completed (step S48). When it is determined that the correction of each gray scale is not completed (NO in step S48), the processing returns to step S2. When it is determined that the correction of each gray scale is completed (YES in step S48), the processing is completed.

Figure 12:
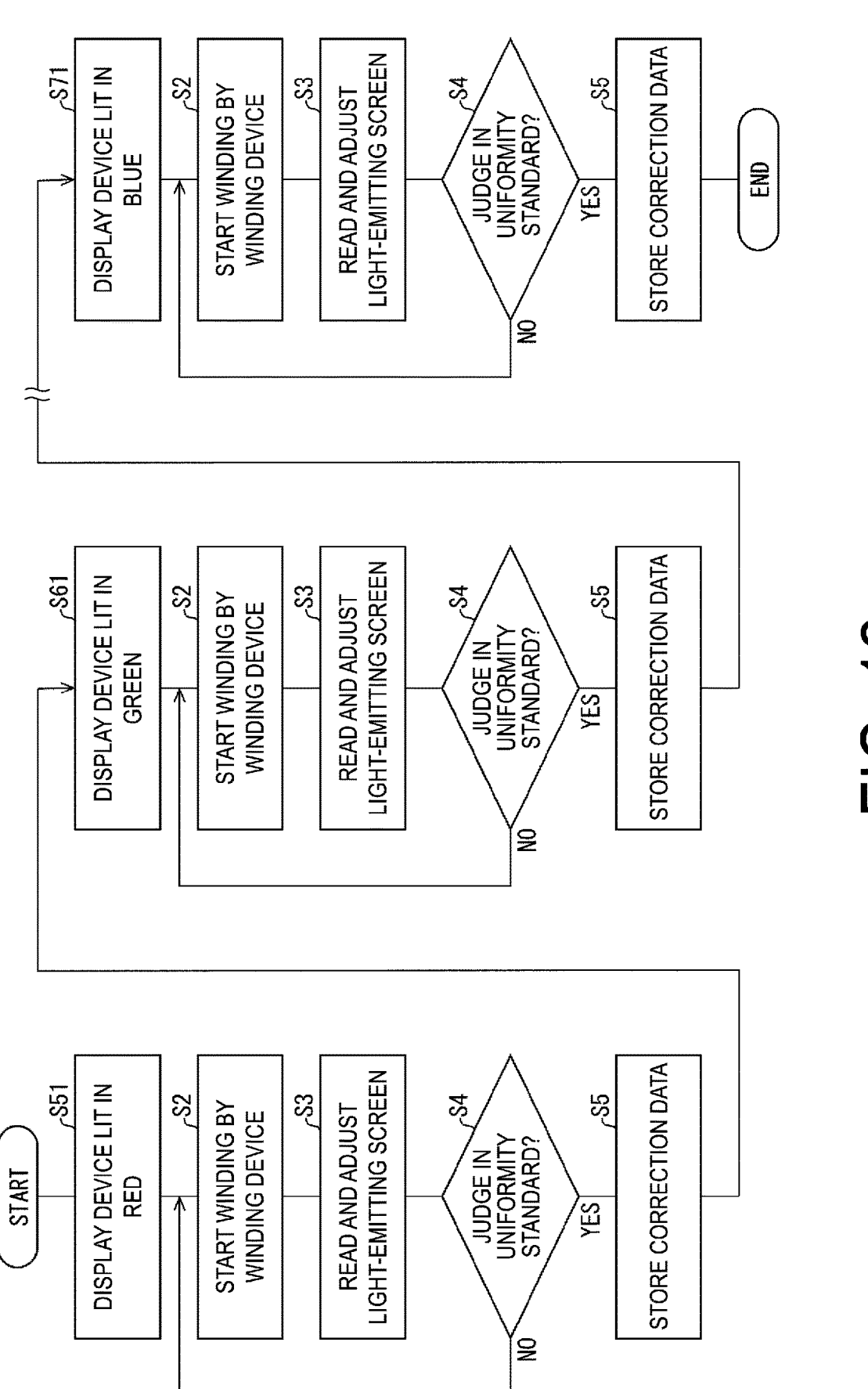
FIG. 12 is a flowchart of correcting gray scale level 1 of RGB single color by the winding-type display device.

FIG. 12 is a flowchart of correcting gray scale level 1 of RGB single color by the winding-type display device 1. The same constituent elements as the constituent elements described above are denoted by the same reference numerals and signs, and detailed descriptions thereof are not repeated.

First, the display 2 to which the protection film 3 is attached is lit in red in a state of being unwound from the box 10 (step S51). Then, winding of the display 2 is started by the winding roller 4 (step S2). Next, the third surface 16 of the display 2 lit in red is read by the image reading sensor 9 (step S3).

Next, the correction unit 13 calculates uniformity (variation) of the N pieces of one row data related to luminance re-measured in step S85 and stored in the temporary storage unit, and compares the calculated uniformity with the specified target uniformity value. When the uniformity (variation) is equal to or greater than the specified target uniformity value (NO in step S4), the processing returns to step S2. When the uniformity (variation) is less than the specified target uniformity value (YES in step S4), the correction unit 13 stores the N pieces of one row data in a storage unit (not illustrated) (step S5).

Then, the display 2 to which the protection film 3 is attached is lit in green in a state of being unwound from the box 10 (step S61). Thereafter, the processing of steps S2 to S5 is executed in the same manner. Next, the display 2 to which the protection film 3 is attached is lit in blue in a state of being unwound from the box 10 (step S61). Thereafter, the processing of steps S2 to S5 is executed in the same manner.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

The invention claimed is:

1. A winding-type display device comprising:
   a light-emitting device which is flexible, the light-emitting device including a light-emitting face;

a protection film configured to be attached to the light-emitting face;
   a roller configured to wind the protection film and the light-emitting device with the protection film outside the light-emitting device;
   a first guide member configured to guide the protection film peeled from the light-emitting device when the protection film and the light-emitting device are wound around the roller; and
   an image reading sensor configured to detect light emission information from the light-emitting face of the light-emitting device from which the protection film is peeled,
   wherein the protection film guided by the first guide member is attached again to the light-emitting face of the light-emitting device when the light-emitting face of the light-emitting device is wound by the roller onto a downstream side of a detection position of the light emission information by the image reading sensor.

2. The winding-type display device according to claim 1, further comprising:
   a second guide member configured to guide the protection film on a side opposite to the light-emitting device of the protection film at a position where the light-emitting device starts to come into contact with the roller during winding.

3. The winding-type display device according to claim 1, wherein the first guide member is provided rotatably in accordance with winding of the protection film around the roller.

4. The winding-type display device according to claim 1, further comprising:
   a box configured to accommodate the roller, the first guide member, and the image reading sensor in a manner of being shielded from dust,
   wherein the box has an entrance through which the light-emitting device with the protection film attached enters and exits.

5. The winding-type display device according to claim 1, further comprising:
   an electrostatic control device disposed between the first guide member and the roller and configured to control static electricity generated in accordance with peeling of the protection film from the light-emitting device.

6. The winding-type display device according to claim 5, further comprising:
   a third guide member and a fourth guide member,
   wherein the first guide member is disposed on a side opposite to the roller with respect to the electrostatic control device, and
   the third guide member is disposed on a side opposite to the roller with respect to the image reading sensor and guides the protection film wound around the roller, and
   the fourth guide member is disposed between the first guide member and the third guide member and guides the protection film on a side opposite to the light-emitting device of the protection film.

7. The winding-type display device according to claim 1, further comprising:
   a correction unit configured to correct light emission luminance of the light-emitting face based on light emission information from the light-emitting face detected by the image reading sensor.

8. The winding-type display device of claim 1, wherein the light-emitting device includes a display.

9. The winding-type display device according to claim 8, wherein the display includes an OLED.

10. A method for detecting light emission information of a winding-type display device, comprising:

winding a protection film configured to be attached to a light-emitting face of a light-emitting device which is flexible and the light-emitting device around a roller or unwinding the protection film and the light-emitting device from the roller with the protection film outside the light-emitting device;

peeling the protection film from the light-emitting device when the protection film is wound around the roller or unwound from the roller and guiding the protection film by a first guide member;

detecting, by an image reading sensor, light emission information from the light-emitting face of the light-emitting device from which the protection film is peeled; and attaching the protection film guided by the first guide member to the light-emitting face of the light-emitting device again when the light-emitting face of the light-emitting device is wound by the roller onto a downstream side of a detection position of the light emission information by the image reading sensor or is unwound onto an upstream side of the detection position of the light emission information by the image reading sensor.

* * * * *